United States Patent

Nishiguchi et al.

Patent Number: 5,262,355
Date of Patent: Nov. 16, 1993

[54] METHOD FOR PACKAGING A SEMICONDUCTOR DEVICE

[75] Inventors: Masanori Nishiguchi; Atsushi Miki, both of Yokohama, Japan

[73] Assignee: Sumitomo Electric Industries, Ltd., Osaka, Japan

[21] Appl. No.: 31,502

[22] Filed: Mar. 15, 1993

Related U.S. Application Data

[62] Division of Ser. No. 717,015, Jun. 18, 1991, Pat. No. 5,212,880.

[30] Foreign Application Priority Data

Jun. 19, 1990 [JP] Japan .................. 2-160346
Jul. 6, 1990 [JP] Japan .................. 2-178721

[51] Int. Cl.⁵ .................................. H01L 21/60
[52] U.S. Cl. ........................ 437/209; 437/7; 437/8; 437/215; 437/217
[58] Field of Search ............. 437/209, 2, 3, 4, 5, 437/7, 8, 215, 217, 220

[56] References Cited

U.S. PATENT DOCUMENTS 3,735,911  5/1973  Ward .
3,923,584  12/1975  Hojo et al. .
4,671,446  6/1987  Sherman .
4,677,473  6/1987  Okamoto et al. .
4,817,849  4/1989  Yamamoto et al. ........... 437/209
4,833,621  5/1989  Umatake ........................ 437/8
4,896,206  1/1990  Denham .
4,899,921  2/1990  Bendat et al. .
4,902,631  2/1990  Downey et al. ................ 437/8

OTHER PUBLICATIONS

Serway, "Interference of Light Waves", Physics for Scientists and Engineers, 1982, p. 791.

Primary Examiner—Brian E. Hearn
Assistant Examiner—Kevin M. Picardat
Attorney, Agent, or Firm—Cushman, Darby & Cushman

[57] ABSTRACT

This invention is directed to a method for packaging a semiconductor flip chip on a substrate by face-down bonding in which coherent light is used to irradiate a bonding head and the substrate, and the light reflected by the bonding head and the substrate form interference patterns. Adjustment of the inclination of the bonding head against the substrate is performed by observation of the interference fringes caused by the interference between the light reflected by the bonding head and the light reflected by the substrate.

5 Claims, 4 Drawing Sheets

METHOD FOR PACKAGING A SEMICONDUCTOR DEVICE

This is a division of application Ser. No. 07/717,015, filed Jun. 18, 1991, now U.S. Pat. No. 5,212,880.

BACKGROUND OF THE INVENTION

1. Field of The Invention

The present invention relates to a method and apparatus for packaging a semiconductor device, and more particularly to a method and apparatus for packaging a semiconductor device to a substrate by face-down bonding.

2. Related Background Art

A flip chip packaging technique in face-down bonding has recently been attracting interest in view of increased packaging density and workability in packaging a semiconductor device onto a substrate. This method is described in an article entitled "Technology Trend of Flip Chip Packaging", Electronic Packaging Technology, December 1989. When a flip chip is to be packaged onto the substrate by the face-down method, it is bonded while it is kept parallel to a plane of the substrate to which the semiconductor device is packaged. In the prior art, however, the face-down bonding is carried out without adjustment after an initial adjustment of the packaging apparatus to adjust a parallelism between a bonding head and the plane of the substrate. Thus, in this method, the semiconductor device may not be bonded to the plane of the substrate without failure. To solve this problem, the semiconductor device is observed by a TV camera mounted beside a bonding head which sucks and holds the semiconductor device during the face-down bonding process to watch the parallelism between the bonding head and the substrate.

In the prior art method described above, the parallelism of only several $\mu m/10$ mm is attained between the semiconductor device having the bump formed thereon and the substrate to which the semiconductor device is to be bonded. Accordingly, it cannot comply with high density packaging which requires that a bump height of the flip chip is smaller than 10 $\mu m$.

SUMMARY OF THE INVENTION

The present invention intends to solve the above problem and provide a semiconductor device packaging apparatus which can comply with the high density packaging.

It is an object of the present invention to provide an apparatus for packaging a semiconductor device comprising: bonding head having a holding plane adapted to hold a semiconductor device having a bump electrode formed on a front surface thereof by sucking a rear surface thereof and a light reflective plane formed around the holding plane; a stage opposed to said holding plane adapted to hold a substrate on which the semiconductor device is to be face-down bonded; irradiation means for irradiating a coherent light to the light reflective plane and said stage; observing means for causing a light reflected by the light reflective plane to interfere with a light reflected by the substrate held by said stage of the light irradiated by said irradiating means to observe an interference state therebetween to detect the inclination between the semiconductor chip against the substrate; and adjusting means for moving the bonding head against said stage to adjust parallelism between the plane on which the bump electrode of the sucked semiconductor device is formed and the plane of the substrate to which the semiconductor device is to be bonded.

It is a further object of the present invention to provide a method for packaging a semiconductor device comprising the steps of: holding a semiconductor device having a bump electrode formed on a front surface thereof by sucking a rear surface thereof to a sucking surface on a bonding head; irradiating a coherent light to a light reflective plane of the bonding head formed around the sucking surface and a light reflective substrate to which the semiconductor device is to be bonded and held on a stage disposed facing to the bonding head; interfering a light reflected by the substrate and a light reflected by the light reflective light plane of the light irradiated in said irradiative step to detect an interference fringe; moving the bonding head in accordance with a state of the interference fringe detected in said detection step; adjusting a parallelism between the plane on which the bump electrode of the sucked semiconductor device is formed and the plane of the substrate to which the semiconductor device is to be bonded; and face-down bonding the semiconductor device to the substrate.

Concretely, in the method and apparatus for packaging the semiconductor device in a light transmissive substrate, the coherent light is irradiated from the back side of the substrate. The light reflected by the light reflection plane on the bonding head is interfered with the light reflected by the back side of the substrate so that the parallelism between the surface of the semiconductor device and the plane of the substrate is exactly detected. The bonding head is moved in accordance with the detection output so that the parallelism between the surface of the semiconductor device and the plane of the substrate is maintained.

Concretely, in the method and apparatus for packaging the semiconductor device in a light reflective substrate, the coherent light is irradiated from the front side of the substrate. The light reflected by the light reflection plane on the bonding head interferes with the light reflected by the front side of the substrate and is reflected by the light reflection plane so that the parallelism between the surface of the semiconductor device and the plane of the substrate is exactly detected. The bonding head is moved in accordance with the detection output so that the parallelism between the surface of the semiconductor device and the plane of the substrate is maintained.

The present invention will become more fully understood from the detailed description given hereinbelow and the accompanying drawings which are given by way of illustration only, and thus are not to be considered as limiting the present invention. Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DETAILED DESCRIPTION OF THE PREFERRED EMBODIMENT

Figure 1:
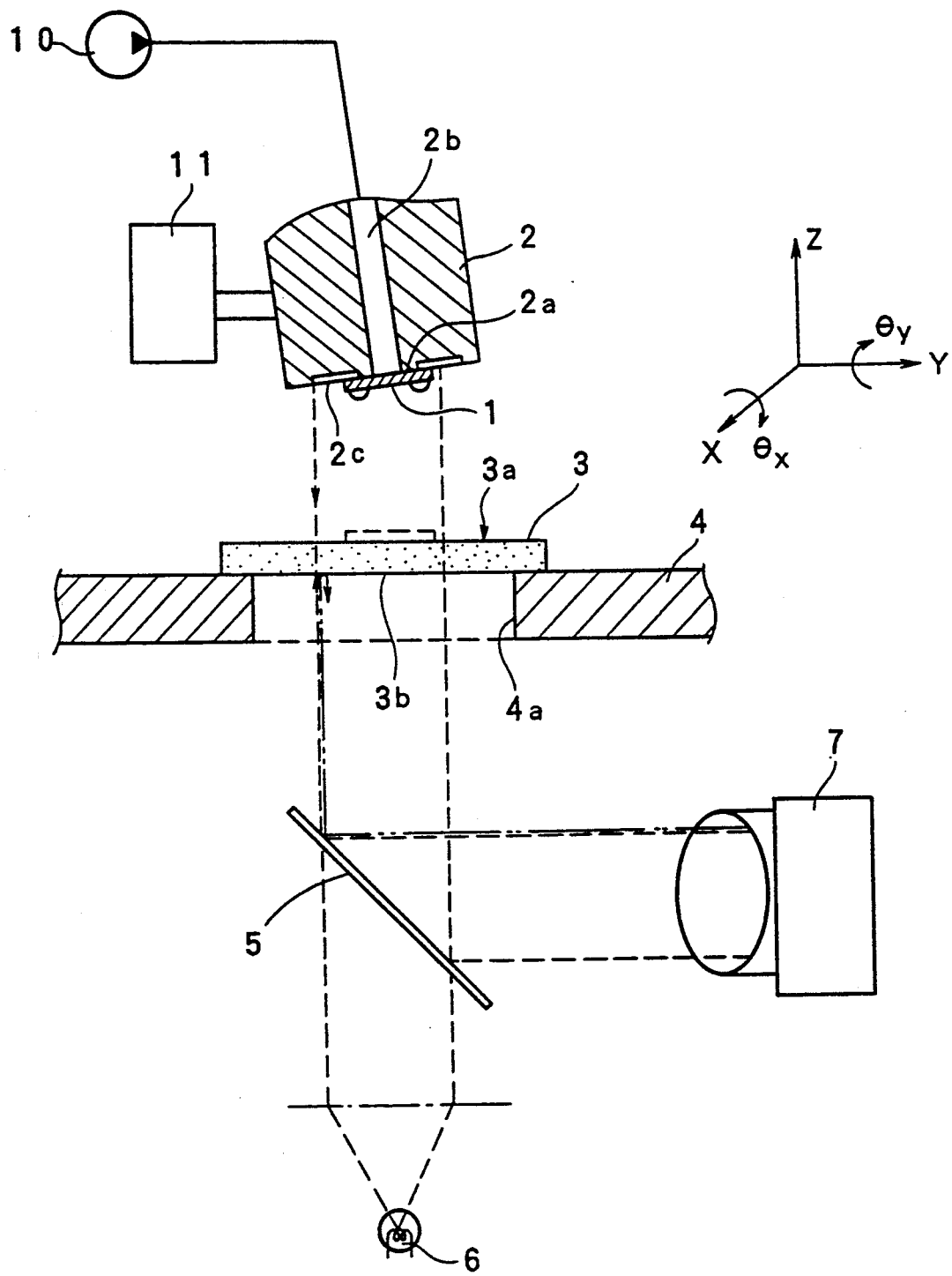
FIG. 1 shows a semiconductor device packaging apparatus of a first embodiment according to the present invention.

FIG. 1 shows a semiconductor device packaging apparatus of a first embodiment according to the present invention, and is used for packaging a semiconductor device in a light transmission substrate.

As shown in FIG. 1, the semiconductor device packaging apparatus has a bonding head 2 which has a plane 2a (sucking plane) for sucking and securing a semiconductor device 1, formed at an end thereof. A through hole 2b connected to a vacuum pump 10 is formed at a center of the plane 2a. A mirror plane 2c (light reflection plane) which is parallel to a bump electrode plane of the semiconductor device (which is to be vacuum-sucked to the sucking plane) is formed around the sucking plane. The mirror plane 2c may be formed by embedding a member made of a highly light-reflective material around the through-hole 2b and polishing it. A position adjusting unit 11 is mechanically connected to the bonding head 2. The bonding head 2 is movable along a Z direction which is perpendicular to an x-y plane which corresponds to a semiconductor mount plane 3a of the light-transmissive substrate 3 mounted on the packaging apparatus, and is also adjustable to an X axis and a Y axis which are parallel to the x-y plane and define a plane which passes through a center of the through-hole 2b on the plane 2a, toward rotation angles $\theta$x and $\theta$y respectively, by the position adjusting unit 11.

A substrate holder 4 of the semiconductor device packaging apparatus has a through-hole 4a so that it can support the substrate 3 at the periphery thereof and permit the irradiation of the light from the bottom side of the substrate 3. The size of the through-hole 4a is preferably larger than the area of the mirror plane 2c formed on the bonding head 2. The substrate holder 4 further has a securing mechanism (not shown) for securing the light transmissive substrate 3 mounted thereon.

A half-mirror 5 is arranged below the through-hole 4a of the substrate holder 4. The half-mirror 5 is fixed at an angle of inclination of 45 degrees to the back side 3b of the light transmissive substrate 3 which is secured to the substrate holder 4. A light source 6 such as a laser beam generator which irradiates a coherent and collimated light perpendicular to the rear surface side 3b of the secured light transmissive substrate 3 is arranged below the half-mirror 5.

A monitor 7 such as a microscope for observing an interference state of the light, more specifically an interference fringe, is arranged beside the half-mirror 5. The microscope 7 is positioned on a line extending from the inclined plane of the half-mirror 5 perpendicularly to the direction of propagation of the collimated light emitted from the light source 6. With this arrangement, the interference status between the collimated light emitted from the light source 6 and reflected by the rear surface 3b of the substrate 3 and the light reflected by the mirror plane 2c of the bonding head 2 can be observed.

A method for face-down bonding the semiconductor device 1 to the semiconductor device mount plane 3a on the substrate 3 by using the above apparatus is now explained.

First, the substrate 3 is secured to a predetermined position to cover the through-hole 4a of the substrate holder 4. Then, the semiconductor device 1 is displaced such that the plane opposite to the bump electrode plane covers the through-hole 2b of the bonding head 2, and the semiconductor device 1 is vacuum-sucked by the vacuum pump 10 through the through-hole 2b so that it is sucked and held to the end of the bonding head 2.

Then, the light source 6 is energized to irradiate the laser beam to the rear side of the substrate 3 through the half-mirror 5. The interference state between the light reflected by the rear surface 3b of the substrate 3 and the light reflected by the mirror plane 2c of the bonding head 2 is observed by the microscope 7. If the mirror plane 2c of the bonding head 2 is substantially inclined with respect to the semiconductor device mount plane 3a of the substrate 3, there are too many interference fringes to observe, as shown in FIG. 4(a) using the position adjusting unit 11.

Figure 4:
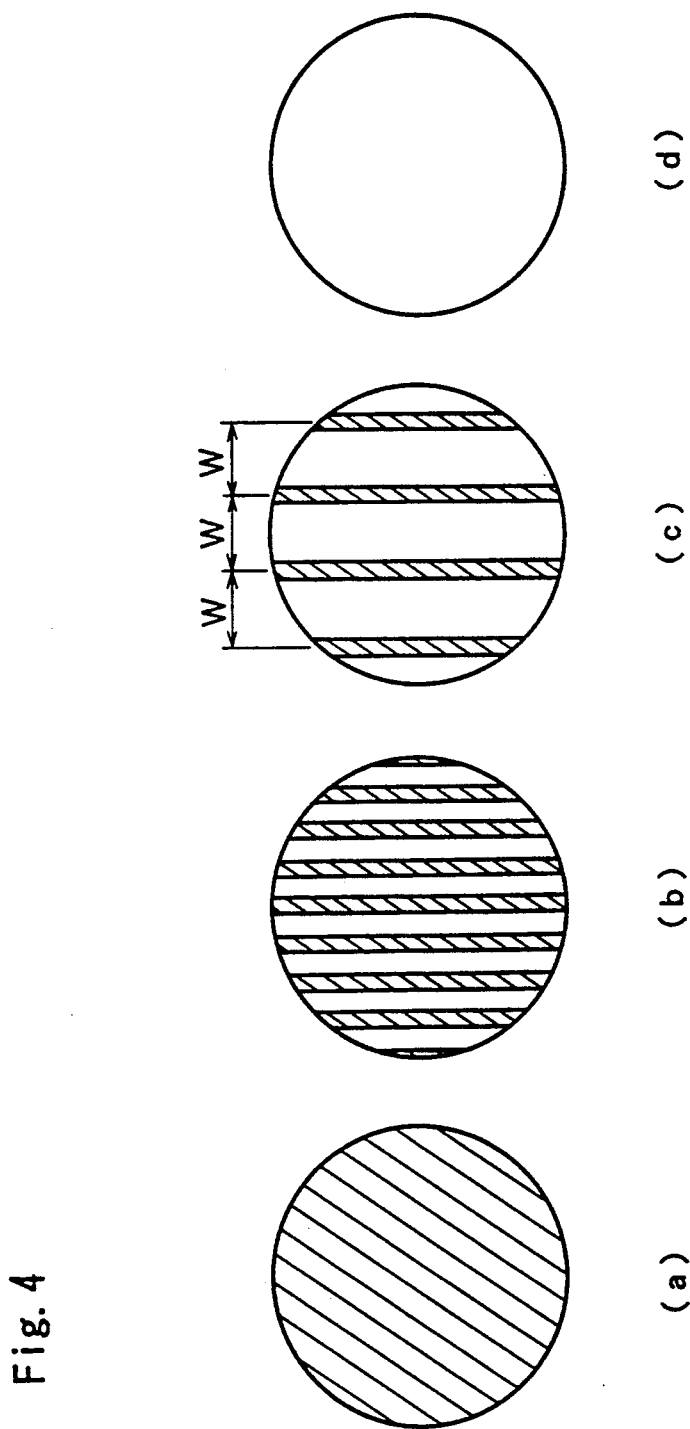
FIG. 4 shows microscope views observed when the semiconductor device is packaged in the embodiments.

In this case, the rotation angle $\theta$x along the X axis and the rotation angle $\theta$y along the Y axis of the bonding head 2 are adjusted to enable the observation of the interference fringes, as shown in FIG. 4(b).

Then, as shown in FIG. 4(c), the rotation angle $\theta$x the X axis and the rotation angle $\theta$y along the Y axis of the bonding head 2 are finely adjusted to expand an interval W of the observed interference fringes. The smaller the angle of inclination of the bonding head 2 with respect to the semiconductor device mount plane 3a of the substrate 3, the larger is the interval of the interference fringes, and when they are perfectly parallel, the interference fringe is not observed. When the interference fringe disappears form a field of view of the microscope 7, the adjustment of the angles of the bonding head 2 is stopped and the bonding head 2 is moved in the $-Z$ direction (descending direction) to effect the face-down bonding. For example, where the observation area is 10 mm on the mirror plane 2c of the bonding head 2 and a He-Ne laser beam having a wavelength of 0.63 $\mu$m is used as the coherent light, an interference fringe appears at every optical path difference of 0.63 $\mu$m. Accordingly, the parallelism between the mirror plane 2c of the bonding head 2 and the semiconductor device mount plan 3a of the substrate 3 is smaller than 0.3 $\mu$m at the distance of 10 mm when the interference fringe is not observed as shown in FIG. 4(d).

In this manner, the parallelism between the plane on which the bump electrode of the semiconductor device 1 is formed and the semiconductor device mount plane 3a of the substrate can be simply and precisely detected, and the inclination of the bonding head 2 is adjusted in accordance with the detection output so that highly accurate face-down bonding is attained.

Figure 2:
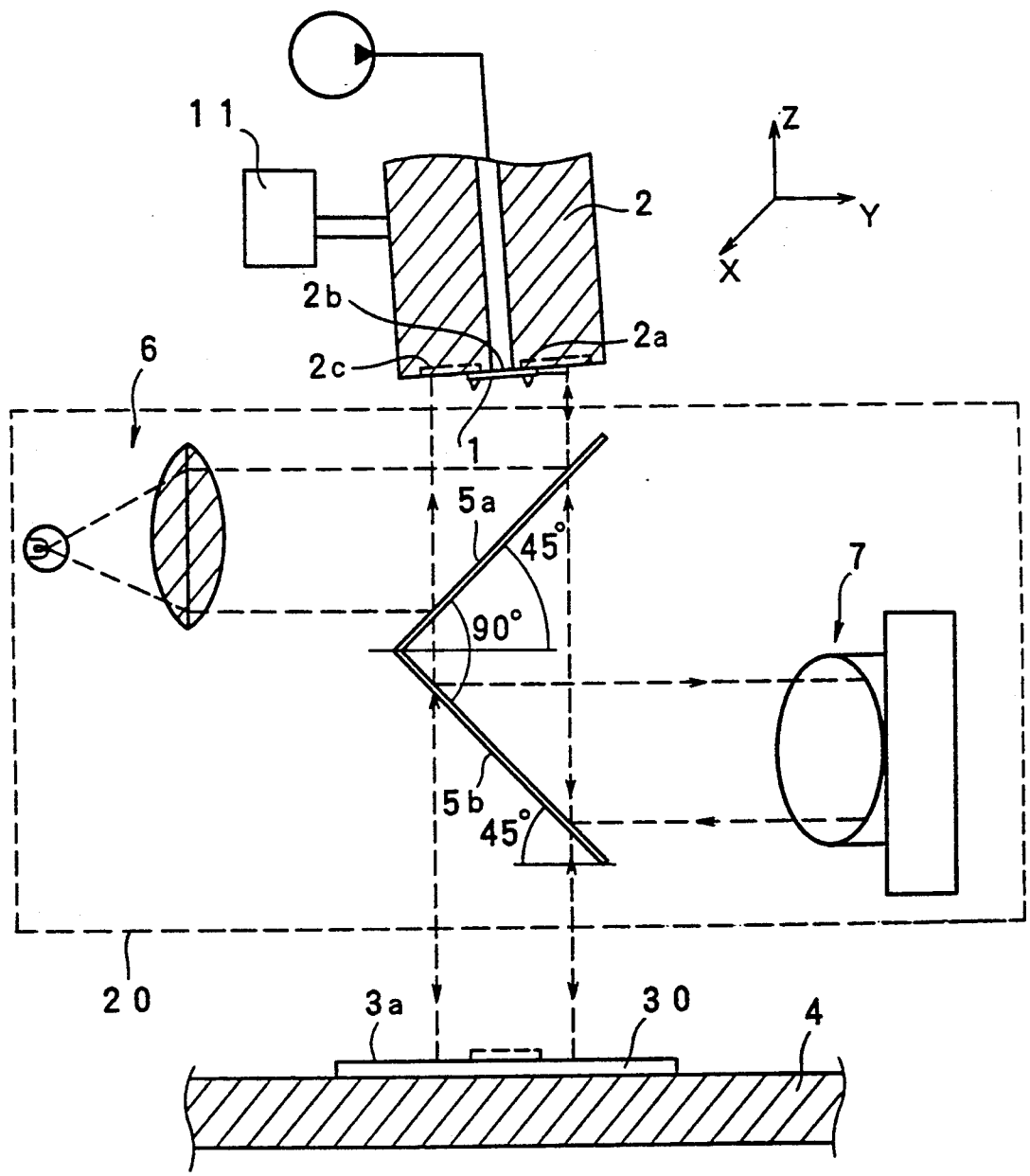
FIG. 2 shown a semiconductor device packaging apparatus of a second embodiment according to the present invention.

FIG. 2 shows a semiconductor device packaging apparatus of a second embodiment according to the present invention used for packaging a semiconductor device in a light substrate.

As shown in FIG. 2, the semiconductor device packaging apparatus has a bonding head 2 which has a plane 2a (sucking plane) for sucking and securing a semiconductor device 1, formed at an end thereof. A through-hole 2b connected to a vacuum pump 10 is formed at a center of the plane 2a. A mirror plane 2c (light reflection plane) which is parallel to a bump electrode plane of the semiconductor device which is to be vacuum-sucked to the sucking plane) is formed around the sucking plane. The mirror plane 2c may be formed by embedding a member made of a highly light-reflective material around the through-hole 2b and polishing it. A position adjusting unit 11 is mechanically connected to the bonding head 2. The bonding head 2 is movable along a Z direction which is perpendicular to a x-y plane which corresponds to a semiconductor mount plane 3a of a light reflective substrate 30 mounted on the packaging apparatus, and also is adjustable to an X axis and a Y axis which are parallel to the x-y plane and define a plane which passes through a center of the through-hole 2b on the plane 2a, toward rotation angles $\theta x$ and $\theta y$, respectively, by the position adjusting unit 11.

A substrate holder 4 of the semiconductor device packaging apparatus has a planar area to support the entire bottom surface of the substrate 3. The substrate holder 4 further has a securing mechanism (not shown) for securing the light reflective substrate 30 mounted thereon.

Figure 3:
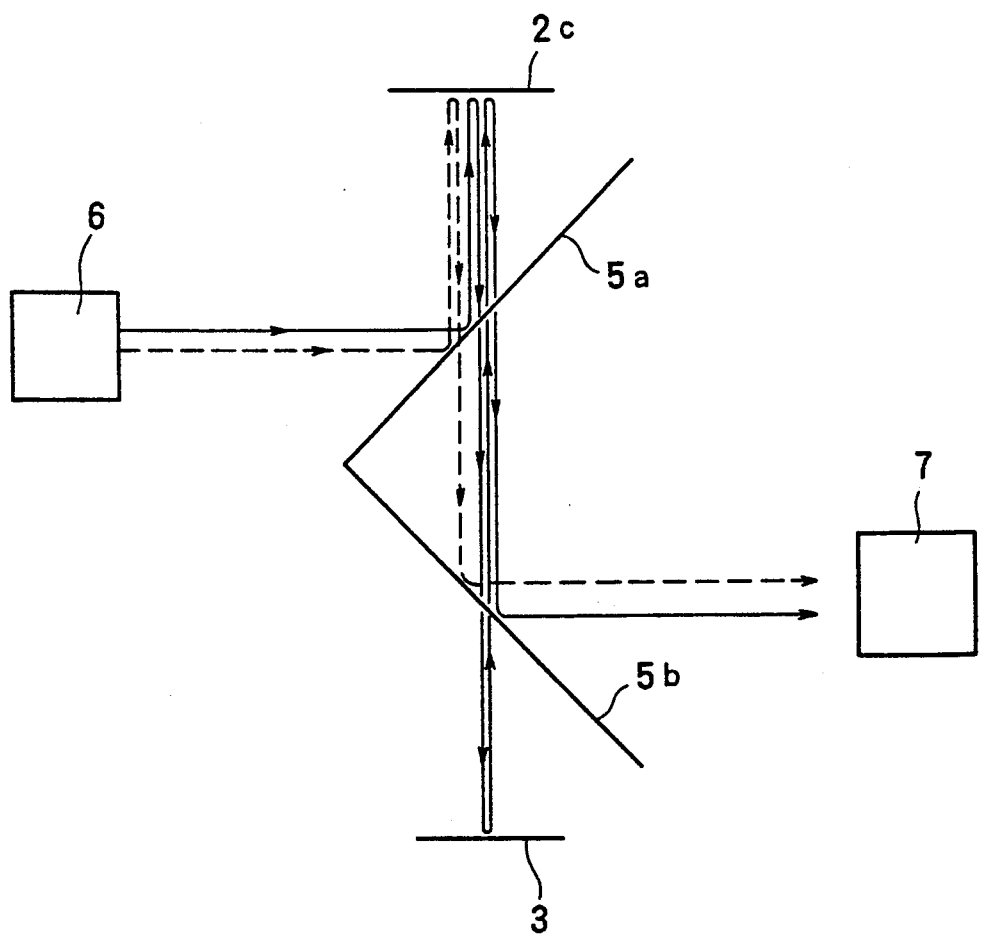
FIG. 3 shows a light path in the semiconductor device packaging apparatus of FIG. 2.

Inclination measurement equipment 20 is arranged above the substrate support plane of the substrate holder 4. The inclination measurement equipment is mounted on a manual or automatic drive mechanism (not shown) so that it is movable between a first position which is between the bonding head 2 and the substrate holder 4 and a second position which is beyond the bonding head 2 or the substrate holder 4. It may be moved either by rotation or by parallel movement. The inclination measurement equipment 20 has a pair of half-mirrors 5a and 5b which are arranged to make angles of 45 degrees, respectively, with respect to the substrate support plane of the substrate holder 4 when the inclination measurement equipment 20 is at the first position. The half-mirrors 5a and 5b make an angle of 90 degrees to each other and the respective edges are connected. A light source 6 such as a laser beam generator which emits a coherent and collimated light at an angle of 45 degrees with respect to the plane of the half-mirror 5a is arranged beside the upper half-mirror 5a, a monitor 7 such as a microscope for observing an interference status of the light reflected by the half-mirror 5b, more specifically, an interference fringe is arranged beside the lower half-mirror 5b opposite to the light source 6. The microscope 7 is arranged in a path of the collimated light emitted from the light source 6 to the half-mirror 5a to face the inclined plane of the half-mirror 5b. By this arrangement, an interference state between the collimated light emitted from the light source 6, reflected upward by the half-mirror 5a, reflected by the mirror plane 2c of the bonding head 2 and reflected by the half-mirror 5b toward the microscope 7 and the collimated light emitted from the light source 6, reflected upward by the half-mirror 5a, reflected by the mirror plane 2c of the bonding head 2, transmitted through the half-mirrors 5a and 5b, reflected by the mirror plane 2c and reflected by the mirror plane 2c and reflected by the half-mirror 5b toward the microscope 7, can be observed. The light path thereof is shown in FIG. 3. The interference state between the broken line light and the solid line light shown in FIG. 3 can be observed through the microscope 7. The relative positions of the half-mirrors 5a and 5b, the light source 6 and the microscope 7 are fixed and they are moved integrally.

A method for face-down bonding the semiconductor device 1 onto the semiconductor device mount plane 3a of the light-reflective substrate 30 by using the above apparatus is now explained.

First, the substrate 30 is secured to a position on the substrate holder 4 facing the bonding head 2. Then, the semiconductor device 1 is disposed such that the opposite plane to the plane on which the bump electrode is formed covers the through-hole 2b of the bonding head 2, and the semiconductor device 1 is sucked and secured to the end of the bonding head 2 by the vacuum pump 10 through the through-hole 2b.

Then, the inclination measurement equipment 20 is fixed at the first position between the bonding head 2 and the substrate 30. Then, the light source 6 is energized to irradiate the laser beam to the half-mirror 5a. The interference state between the light reflected by the front surface 3a of the substrate 3 and the light reflected by the mirror plane 2c of the bonding head 2 is observed through the microscope 7. Where the mirror plane 2c of the bonding head 2 substantially inclines with respect to the semiconductor device mount plane 3a of the substrate 3, there are too many interference fringes to permit the observation of the interference fringes, as shown in FIG. 4(a). In this case, the rotation angle $\theta x$ along the X axis of the bonding head 2 are adjusted to enable the observation of the interference fringes, as shown in FIG. 4(b).

As shown in FIG. 4(c), the rotation angle $\theta x$ along the X axis and the rotation angle $\theta x$ along the Y axis of the bonding head 2 are finely adjusted to expand an interval w of the observed interference fringes. The smaller the angle of inclination of the bonding head relative to the semiconductor device mount plane 3a of the substrate 3, the larger the interval of the interference fringes. When perfect parallelism is reached, the interference fringe is no longer observed. When the interference fringe disappears from a field of view of the microscope 7, the angle adjustment of the bonding head 2 is stopped and the angles of the bonding head 2 are fixed. Where the observation area is 10 mm on the mirror plane 2c of the bonding head 2 and a He-Ne laser beam having a wavelength of 0.63 $\mu$m is used as the coherent light, an interference fringe appears at every optical path difference of 0.63 $\mu$m. Accordingly, the parallelism between the mirror plane 2c of the bonding head 2 and the semiconductor device mount plane 3a of the substrate 30 is smaller than 0.3 $\mu$m at the distance of 10 mm, when the interference fringe is not observed, as shown in FIG. 4(d).

Then, the inclination measurement equipment 20 is moved to the second position beyond the area between bonding head 2 and the substrate 2. Then, the bonding head 2 is moved in the $-Z$ direction (descending direction) and the face-down bonding is effected.

In this manner, the parallelism between the plane on which the bump electrode of the semiconductor device 1 is formed and the semiconductor device mount plane 3a of the substrate can be simply and precisely detected and the inclination of the bonding head 2 is adjusted in accordance with the detection output so that highly accurate face-down bonding is attained.

The present invention is not limited to the above embodiment and various modification thereof may be mode.

Specifically, although the laser beam is used as the coherent light in the embodiment, any other coherent light may be used. The laser beam is not limited to the He-Ne laser beam.

While the plane 2a of the bonding head 2 is polished to form the mirror plane 2c in the embodiment, a light reflective member may be bonded instead.

In the method and apparatus for packaging the semiconductor device of the present invention, the parallelism between the semiconductor device and the substrate is detected by using the interference of the lights, as described above. Accordingly, the exact face-down bonding can be attained even for the semiconductor device having a fine bump.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

We claim:

1. A method for packaging a semiconductor device comprising the steps of:
    holding a semiconductor device having a bump electrode formed on a front surface thereof to a sucking surface, said sucking surface being disposed on a bonding head;
    irradiating a coherent light to a light reflective plane disposed on the bonding head around the sucking surface so that a portion of said light is reflected from said light reflective plane and to a light reflective substrate so that a portion of said light is reflected from said light reflective substrate, where the semiconductor device is to be bonded and held on a stage disposed on said light reflective substrate and facing the bonding head;
    interfering the portion of the light reflected by the substrate and the portion of the light reflected by the light reflective plane to form an interference fringe;
    detecting said interference fringe;
    moving the bonding head in accordance with a state of the interference fringe detected in said detection step by adjusting a parallelism between the plane on which the bump electrode of the sucked semiconductor device is formed and a plane of the substrate to which the semiconductor is to be bonded; and
    face-down bonding the semiconductor to the substrate.

2. A method according to claim 1, wherein the substrate is a light transmissive substrate and the coherent light is irradiated from a read side of the substrate.

3. A method according to claim 2, wherein:
    said irradiating step comprises the steps of:
    passing said light through the substrate;
    reflecting a portion of said light from said substrate;
    reflecting a portion of said light from said light reflective plane.

4. A method according to claim 1, wherein the substrate is light reflection substrate and the coherent light is irradiated from a substrate mount side of the substrate.

5. A method according to claim 4, wherein said irradiating step comprises the steps of:
    reflecting a portion of said light from the light reflection plane; and
    reflecting a portion of said light from the substrate and then from the light reflection plane.

* * * * *